United States Patent
Vogas

(10) Patent No.: US 8,611,843 B2
(45) Date of Patent: Dec. 17, 2013

(54) COMMUNICATIONS FILTER PACKAGE FOR NARROWBAND AND WIDEBAND SIGNAL WAVEFORMS

(75) Inventor: Michael S. Vogas, Morristown, NJ (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 20 days.

(21) Appl. No.: 13/451,318

(22) Filed: Apr. 19, 2012

(65) Prior Publication Data
US 2012/0286894 A1 Nov. 15, 2012

Related U.S. Application Data

(60) Provisional application No. 61/483,998, filed on May 9, 2011.

(51) Int. Cl.
*H04B 1/10* (2006.01)
(52) U.S. Cl.
USPC ........ 455/286; 455/307; 455/303; 455/191.3; 455/150.1
(58) Field of Classification Search
USPC .............. 455/286, 307, 303, 191.3, 150.1
See application file for complete search history.

(56) References Cited

U.S. PATENT DOCUMENTS

| | | | |
|---|---|---|---|
| 7,460,851 B2 | 12/2008 | Chiu et al. | |
| 8,331,895 B2* | 12/2012 | Katsube et al. | 455/301 |
| 8,422,977 B2* | 4/2013 | Robert | 455/323 |
| 2006/0114969 A1 | 6/2006 | Ahn et al. | |
| 2011/0169545 A1* | 7/2011 | Minassian et al. | 327/356 |

* cited by examiner

*Primary Examiner* — Sanh Phu
(74) *Attorney, Agent, or Firm* — Leo Zucker; Daniel J. Long

(57) ABSTRACT

A filter package for communications equipment includes two or more filters in die form, each having a different frequency response. A first switch and a second switch are operatively connected to the filters and are configured to select a desired filter for operation in a signal stage of the equipment. The filters are aligned and stacked one over the other in the form of a package having an input terminal that is tied to a common terminal of the first switch, and an output terminal tied to a common terminal of the second switch. When the input and the output terminals of the filter package are connected to corresponding terminals of an intermediate frequency (IF) stage in a communications transceiver, the package can support both narrowband and wideband waveforms defined by the Joint Tactical Radio System (JTRS).

12 Claims, 3 Drawing Sheets

COMMUNICATIONS FILTER PACKAGE FOR NARROWBAND AND WIDEBAND SIGNAL WAVEFORMS

CROSS REFERENCE TO RELATED APPLICATION

This application claims priority under 35 U.S.C. §119(e) of U.S. Provisional Patent Application No. 61/483,998 filed May 9, 2011, titled "Stacked SAW Filter Implementation to Allow for Multiple IF Bandwidths in a Small Space" and incorporated by reference in its entirety.

BACKGROUND OF THE INVENTION

1. Field of the Invention

The present invention relates to packaging of radio receiver circuits or devices, particularly communications filters.

2. Discussion of the Known Art

Radio frequency (RF) transceivers for the Joint Tactical Radio System (JTRS) typically have bandpass filters arranged in an intermediate frequency (IF) stage of the transceiver to support the reception and transmission of signal waveforms defined by the JTRS. The waveforms are referred to as being either "narrowband" or "wideband" depending on the bandwidth needed to pass the waveforms through various stages of a transceiver or radio without distortion. Waveforms whose bandwidths are less than 3 MHz wide are generally considered narrowband, and waveforms with bandwidths of 3 MHz or greater are referred to as wideband. Typical uses and bandwidth requirements for several JTRS signal waveforms including WNW, SRW, NCW, HNW, and MUOS are disclosed in T. Mann, JTRS/WIN-T: Networking Waveform Quick Reference Sheets, on the Web at findarticles.com/p/articles/ (Summer 2008), which is incorporated by reference. See also, IT Mentor Group, Inc., Joint Tactical Radio System, on the Web at itmentor.com/jtrs.htm; and Joint Tactical Radio System, at en.wikipedia.org/wiki/JTRS.

Small form factors specified by the military for tactical vehicular radios, as well as cost considerations, tend to limit the number of filters that can be provided with associated switches and matching circuits inside one radio. For example, as shown in FIG. 1, an IF signal stage of a core radio developed by BAE Systems includes a switched bank or array 10 of two surface acoustic wave (SAW) bandpass filters 12, 14, for enabling the bandwidth of the stage to be set to either 0.5 MHz or 1.2 MHz. The filters 12, 14, switches 16, 18, and discrete devices for matching the filters electrically with the IF stage, are arrayed individually over an area of defined length and width on the surface of a circuit board 20. The overall dimensions of the entire core radio meet the Ground Mobile Radio (GMR) form factor specified by the JTRS, but the radio supports only a small subset of the various JTRS waveforms.

Under the JTRS, one GMR platform may operate on up to four communication channels, wherein each channel handles one of the JTRS waveforms (e.g., EPLRS, SINCGARS, HF ISB/SSB/ALE, SRW, WNW, or UHF DAMA SATCOM). See, P. H. Sniffen, Joint Tactical Radio System: AMF, GMR, HMS, on the Web at low-powerwireless.com/blog/designarticles/ (March 2012), which is incorporated by reference.

U.S. Pat. Pub. 2006/0114969 (Jun. 1, 2006) describes a data transmission device including an array of four SAW filters the inputs of which are switched selectively to receive a pulse signal, and the outputs of which are combined to produce analog signals having different frequency characteristics. U.S. Pat. No. 7,460,851 (Dec. 2, 2008) discloses a device for integrating a single SAW filter and a transceiver by encapsulating them to form an integrated chip.

Experience has shown that radios conforming to the GMR form factor are too large and costly to be deployed in some military vehicles including tanks, and fall short of meeting certain design objectives. While satisfying many needs, JTRS signal waveforms such as the Soldier Radio Waveform (SRW) and the Wideband Networking Platform (WNW) require more affordable, smaller, lighter, and less power consuming hardware if the waveforms are to be used as intended to support present and future tactical operations. Accordingly, there is a need for a method of packaging multiple filters with associated switches and devices compactly in a tactical vehicular radio, so that the radio can support a number of different narrowband and wideband signal waveforms without an increase in physical dimensions or cost.

SUMMARY OF INVENTION

According to the invention, a filter package for use in communications equipment includes two or more filters each in die form and having different frequency response characteristics, and a first switch and a second switch each in die form. The switches are operatively connected to the filters, and are configured to select one of the filters for operation in a signal stage of the equipment.

The filters are stacked one over the other in the form of a compact filter package. An input terminal on the package is coupled to a common terminal of the first switch for establishing a first connection between an input of a selected filter and a first terminal of the signal stage of the equipment, and an output terminal on the package is coupled to a common terminal of the second switch for establishing a second connection between an output of the selected filter and a second terminal of the signal stage.

For a better understanding of the invention, reference is made to the following description taken in conjunction with the accompanying drawing and the appended claims.

DETAILED DESCRIPTION OF THE INVENTION

Figure 2:
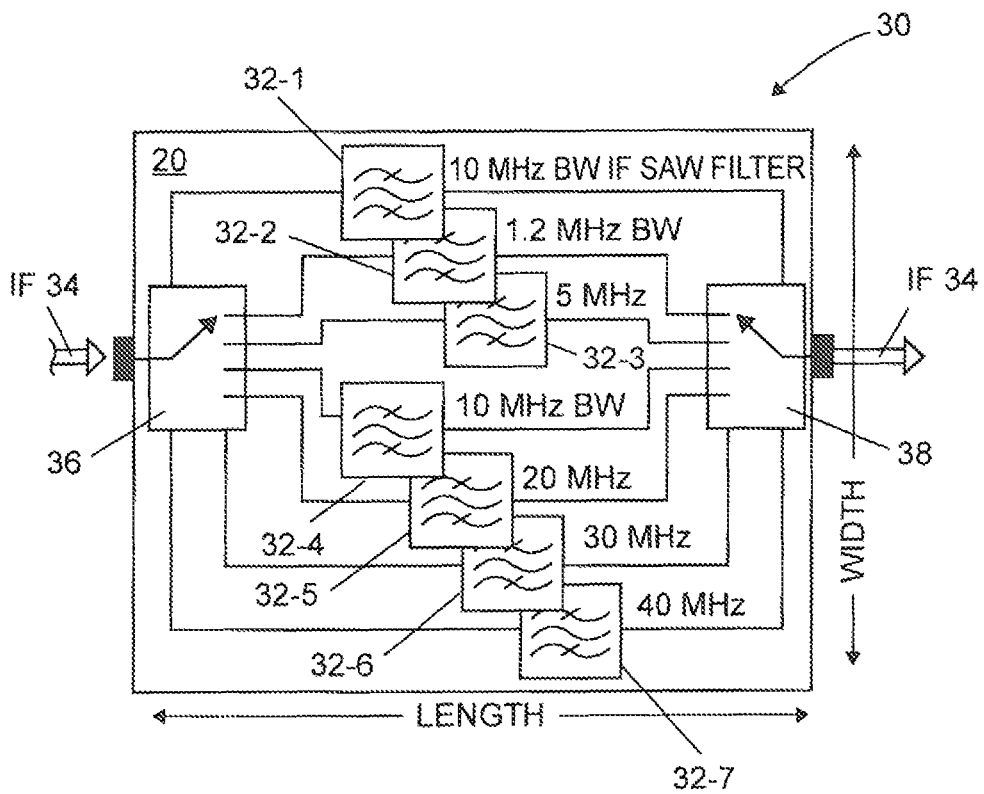
FIG. 2 is a block diagram of a communication filter package according to a first embodiment of the invention, on the circuit board of FIG. 1.
Figure 3:
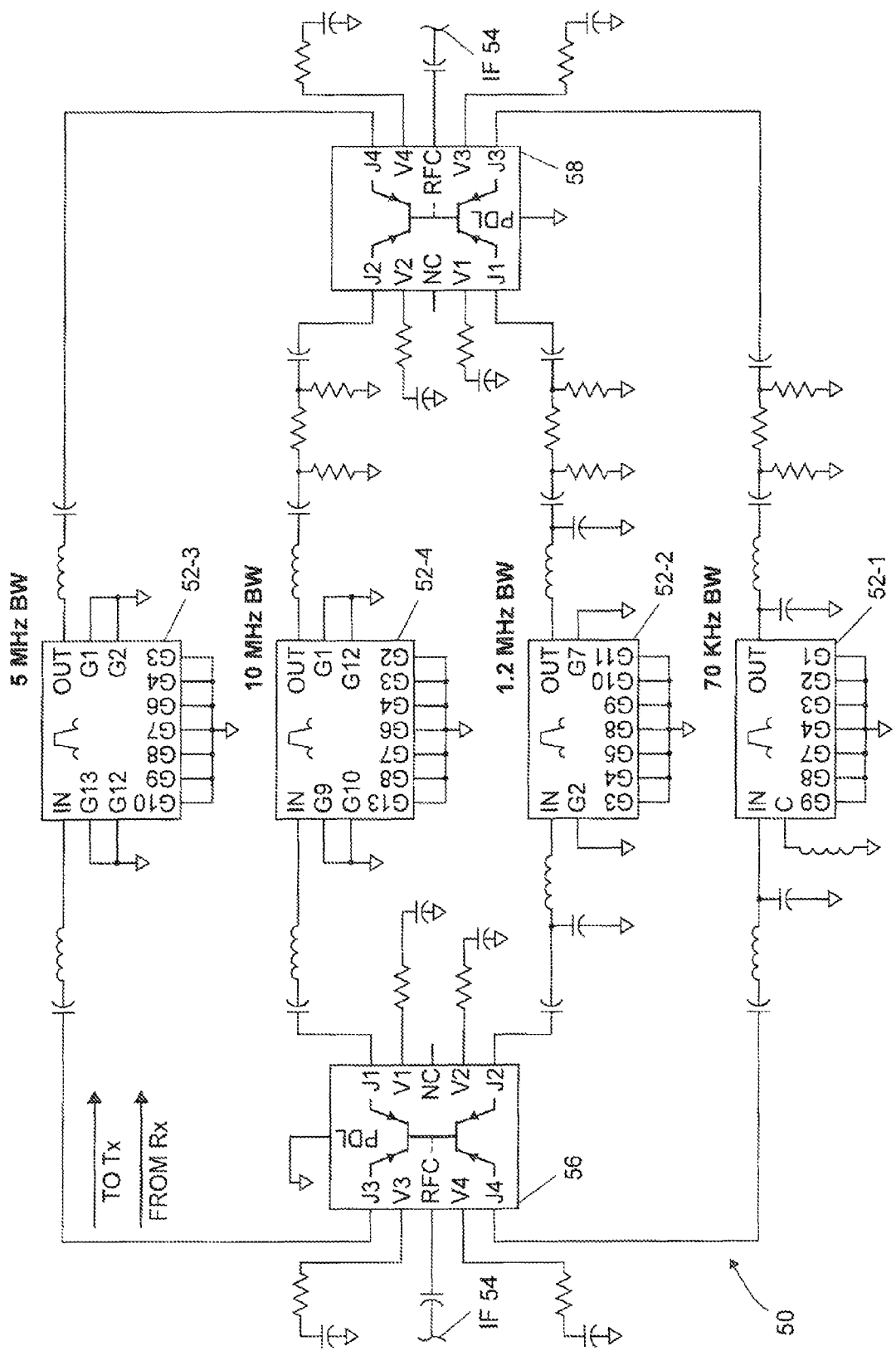
FIG. 3 is a schematic block diagram of a filter package according to a second embodiment of the invention.
Figure 4:
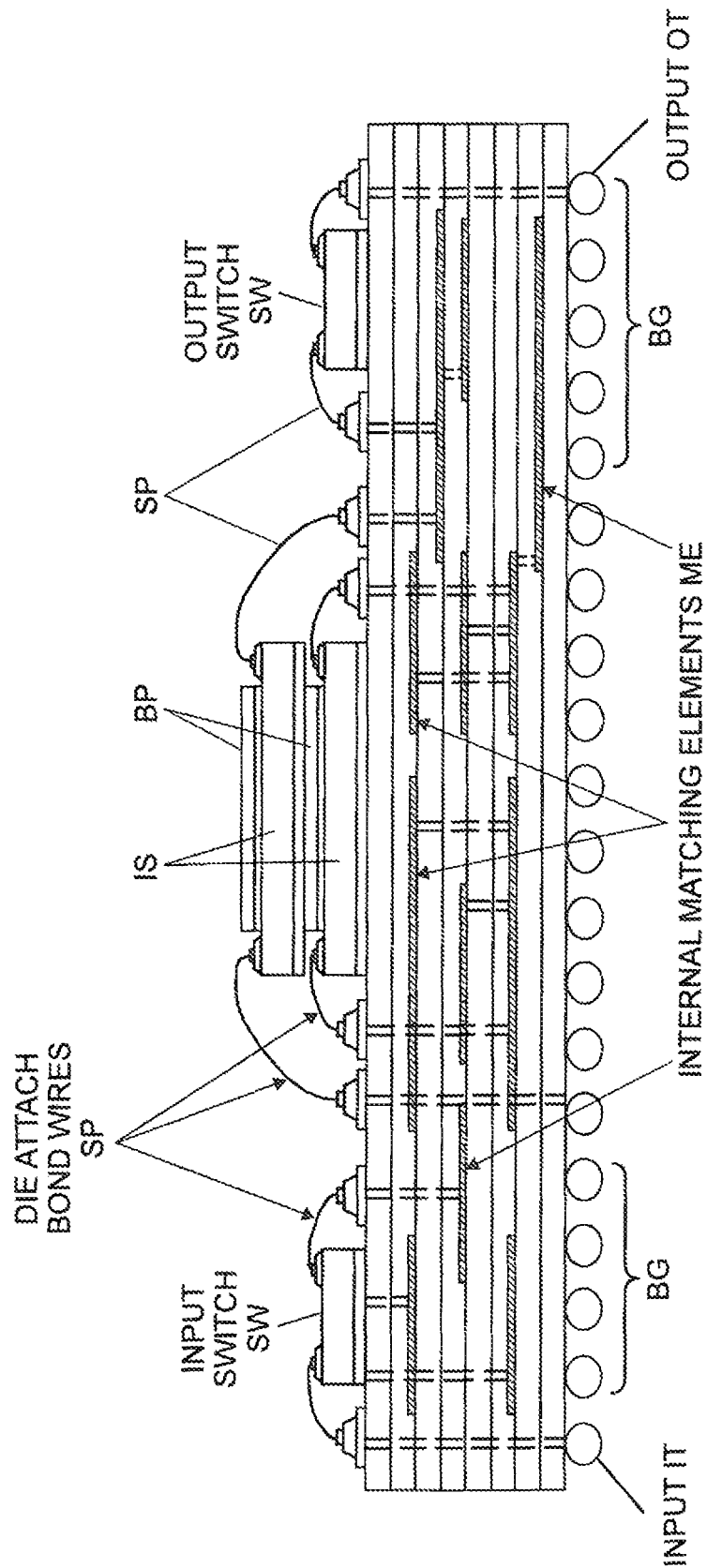
FIG. 4 illustrates an assembly procedure for components of the filter packages of FIGS. 2 and 3.

FIGS. 2 to 4 show communications filter packages according to the invention. The configurations of the packages facilitate the production of a tactical radio that is compatible with the electrical and software architecture of a GMR radio, and which can support both narrowband and wideband JTRS waveforms as well as other communications waveforms that are transmitted over a wider RF spectrum, e.g., 30 MHz to 6 GHz.

In the embodiment shown in FIG. 2, a filter package 30 includes seven SAW bandpass filters 32-1, 32-2, ..., 32-7 that are individually selected and inserted in series with terminals of an IF stage 34 of a radio, by operation of solid state switches 36, 38 that are operatively connected to corresponding input and output terminals of each of the filters. The filter package 30 allows the bandwidth of the IF stage 34 to be set at, for example, one of seven values between 70 kHz and 40 MHz by the operation of the switches 36, 38, thus supporting both narrowband and wideband JTRS waveforms and other signal waveforms as well.

Figure 1:
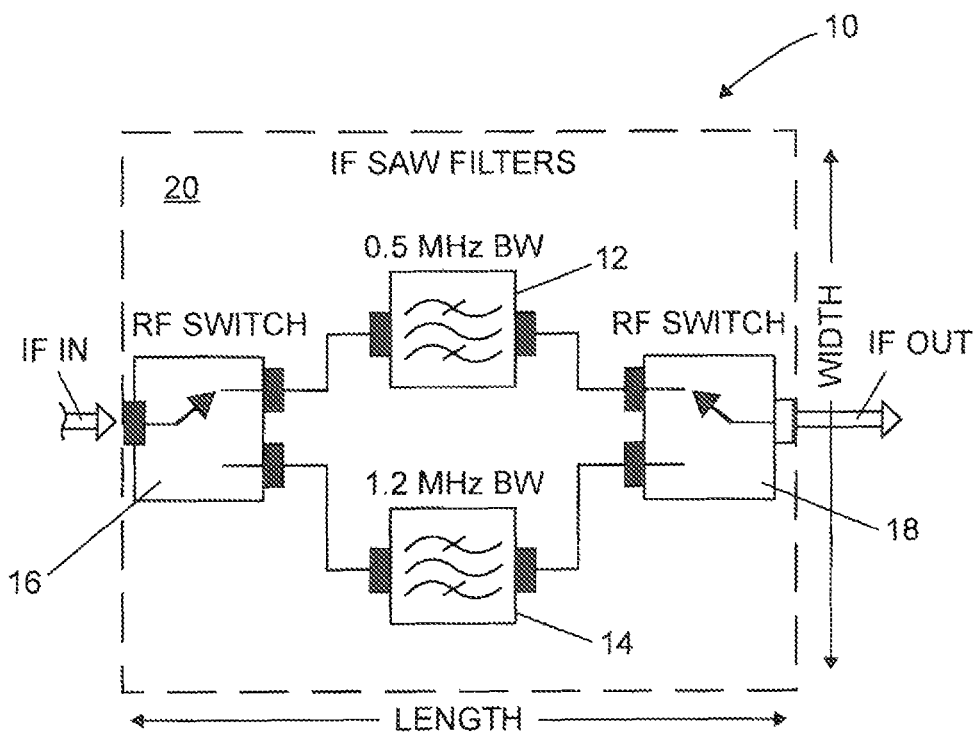
FIG. 1 is a block diagram of a communications filter array laid out over a defined area on a circuit board.

Specifically, in the filter package 30, the bandpass filters 32-1 to 32-7, the input and the output switches 36, 38, and discrete matching elements (inductors, capacitors, and resistors) are aligned and stacked one over the other in Low Temperature Co-fired Ceramic (LTCC) form to realize a compact filter package that can be mounted well within the same area or footprint on the circuit board 20 as the filter array 10 in FIG. 1. See FIG. 4 and related text below. In the embodiment of FIG. 2, the nominal frequency of the IF stage 34 is set, e.g., to 70 MHz, and the passbands of the filters 32-1 to 32-7 are valued at 70 kHz, 1.2 MHz, 5 MHz, 10 MHz, 20 MHz, 30 MHz, and 40 MHz, all centered about the nominal IF of 70 MHz. The filters 32-1 to 32-7 are commercially available from, e.g., Sawtek or TeleFilter GmbH in die form as flat rectangular ceramic packages with terminals exposed at spaced intervals about the perimeter of each package. The switches 36, 38 are also available in die form from, e.g., Skyworks Solutions.

It will be appreciated that by aligning and stacking the components of the filter package, the degree of functionality integrated over a given area of the circuit board 20 is substantially increased. In addition, the high speed electrical performance of the components is enhanced by having relatively short signal paths to connect the filters 32-1 to 32-7, switches 36, 38, and matching elements to one another when stacked as in FIG. 4. That is, parasitic inductance and capacitance that is produced by longer signal paths in the filter array 10 in FIG. 1, is substantially reduced in the filter package 30.

FIG. 3 is a schematic block diagram of a second embodiment of a filter package 50 according to the invention. In FIG. 3, the nominal frequency of an IF stage 54 in a communications transceiver is set, e.g., to 70 MHz. The filter package 50 includes four bandpass filters 52-1 to 52-4 valued at 70 kHz, 1.2 MHz, 5 MHz, and 10 MHz, all centered about the nominal IF of 70 MHz. Input and output switches 56, 58 in the package 50 cooperate with one another for selectively connecting each of the filters in series with the terminals of the IF stage 54.

FIG. 4 illustrates the assembly of the components of either of the filter packages 30, 50. As shown in the drawing, the dies of each bandpass filter BP are aligned and stacked one over the other in a determined order, with an insulating substrate IS sandwiched between adjacent ones of the filters BP. The matching elements ME for each of the filters BP are preferably embedded in one or more substrates in LTCC form that are supported in a region between a lowermost filter substrate carrier and a ball grid array BG provided at the bottom of the stack for connecting the package with corresponding terminals on a circuit board. The array input and output switches SW are mounted atop the uppermost substrate in which the matching elements ME are embedded, as shown.

Signal paths SP for connecting terminals of each of the filter package components to their corresponding embedded matching elements are formed with bond wires in accordance with the schematic diagram in FIG. 3. An input terminal IT is provided on the package, and the terminal IT connects as shown to a common terminal of input switch SW to establish a first connection between the input of a selected filter and a first terminal of the signal stage. An output terminal OT on the package connects as shown to a common terminal of the output switch SW to make a second connection between the output of the selected filter and a second terminal of the signal stage.

The inventive filter package can be used in a communications transceiver or radio that is configured for operation in JTRS programs other than GMR, for example, HMS, AMF, and MIDS. With the appropriate filters, the same radio may be used for applications beyond JTRS, for example, SIGINT, test equipment, and high-band data links like CDL.

As disclosed herein, a number of filters, switches, and discrete electrical elements are stacked, interconnected, and packaged to form a compact filter array. By incorporating the inventive filter array, a radio can support all JTRS narrowband and wideband waveforms in a tactical environment while maintaining a small form factor. Moreover, the filter package can support important narrowband waveforms that have been allocated for use in the VHF radio spectrum and are not currently supported by existing GMR radios.

While the foregoing represents preferred embodiments of the present invention, it will be understood by persons skilled in the art that various modifications, additions, and changes can be made without departing from the spirit and scope of the invention. For example, filters other than the SAW bandpass type may be assembled and stacked in the form of a compact filter package as disclosed herein. Such filters include, among others, bulk acoustic wave (BAW) filters, band reject or notch filters, high pass filters, traps, and combinations thereof. Accordingly, the invention includes all such modifications and changes as are within the scope of the appended claims.

I claim:

1. A filter package for communications equipment, comprising:
   two or more filters each in die form and having different frequency response characteristics;
   a first switch and a second switch each in die form, wherein the switches are coupled to the filters, and are arranged to cooperate to insert a selected one of the filters for operation in a signal stage of the communications equipment;
   the filters and the switches are aligned and stacked one over the other in the form of a filter package;
   an input terminal disposed on the package and coupled to a common terminal of the first switch for establishing a first connection between an input of a selected filter and a first terminal of the signal stage; and
   an output terminal disposed on the package and coupled to a common terminal of the second switch for establishing a second connection between an output of the selected filter and a second terminal of the signal stage;
   wherein the filters are bandpass filters. and the bandpass filters are centered at a nominal frequency that corresponds to an intermediate frequency (IF) stage of the communications equipment.

2. A filter package according to claim 1, wherein the bandpass filters are surface acoustic wave (SAW) filters.

3. A filter package according to claim 1, wherein the bandpass filters have bandwidths that correspond to bandwidths of waveforms defined by the Joint Tactical Radio System (JTRS).

4. A filter package according to claim 3, wherein the bandpass filters have values that correspond to one or more narrowband waveforms and to one or more wideband waveforms defined by the JTRS.

5. A filter package according to claim 1, including discrete components for matching the bandpass filters with the signal stage of the communications equipment.

6. A filter package according to claim 5, wherein the discrete components are mounted on a substrate in die form, and the substrate is stacked with the filters and the switches.

7. A filter package according to claim 1, including a ball grid array fixed at a bottom end of the filter package, for operatively connecting components of the package with corresponding terminals on a circuit board.

8. A method of assembling a filter package for communications equipment, comprising:

providing two or more filters each in die form and having different frequency response characteristics;

providing a first switch and a second switch each in die form;

aligning and stacking the filters and the switches one over the other in the form of a filter package;

coupling the switches to the filters, and configuring the switches to cooperate with one another to insert a selected one of the filters for operation in a signal stage of the communications equipment;

arranging an input terminal on the filter package, and coupling the input terminal to a common terminal of the first switch for establishing a first connection between an input of a selected filter and a first terminal of the signal stage; and arranging an output terminal on the filter package, and coupling the output terminal to a common terminal of the second switch for establishing a second connection between an output of the selected filter and a second terminal of the signal stage; and selecting the filters in the form of bandpass filters having bandwidths that correspond to bandwidths of waveforms defined by the Joint Tactical Radio System (JTRS).

9. The method of claim 8, including selecting the bandwidths of the bandpass filters to correspond to one or more narrowband waveforms and to one or more wideband waveforms defined by the JTRS.

10. The method of claim 8, including operatively connecting components of the filter package with corresponding terminals on a circuit board by arranging a ball grid array at a bottom end of the filter package.

11. A filter package according to claim 1, wherein the bandwidth of the bandpass filters is centered at approximately 70 MHz.

12. A filter package according to claim 1, wherein the bandpass filters have bandwidths that include two or more of 70 kHz, 1.2 MHz, 5 MHz, 10 MHz, 20 MHz, 30 MHz, and 40 MHz.

* * * * *